US012661602B2

(12) United States Patent
Lim et al.

(10) Patent No.: US 12,661,602 B2
(45) Date of Patent: Jun. 23, 2026

(54) BUBBLER FOR USE IN SEMICONDUCTOR MANUFACTURING PROCESS

(71) Applicant: RC-Tech Co.,Ltd., Yongin-si (KR)

(72) Inventors: Tae Hwa Lim, Yongin-si (KR);
Myeong Mun Kim, Incheon (KR)

(73) Assignee: RC-Tech Co., Ltd., Yongin-si (KR)

( * ) Notice: Subject to any disclaimer, the term of this patent is extended or adjusted under 35 U.S.C. 154(b) by 329 days.

(21) Appl. No.: 18/423,724

(22) Filed: Jan. 26, 2024

(65) Prior Publication Data
US 2024/0278142 A1 Aug. 22, 2024

(30) Foreign Application Priority Data

Jan. 27, 2023 (KR) ........................ 10-2023-0011198

(51) Int. Cl.
| | |
|---|---|
| *B01B 1/00* | (2006.01) |
| *B01F 23/23* | (2022.01) |
| *B01F 23/231* | (2022.01) |
| *H10P 72/00* | (2026.01) |

(52) U.S. Cl.
CPC ............ *B01B 1/005* (2013.01); *B01F 23/231* (2022.01); *H10P 72/0402* (2026.01)

(58) Field of Classification Search
CPC ... B01B 1/005; H01L 21/67017; B01F 23/231
See application file for complete search history.

(56) References Cited

U.S. PATENT DOCUMENTS 4,915,880 A * 4/1990 Jenkins ................... B01F 35/50
215/371

FOREIGN PATENT DOCUMENTS

| | | |
|---|---|---|
| JP | 6-244121 A | 9/1994 |
| JP | 2002-343722 A | 11/2002 |
| JP | 2018-91410 A | 6/2018 |
| KR | 10-2004-0106292 A | 12/2004 |

OTHER PUBLICATIONS

Office Action for KR 10-2023-0011198 by Korean Intellectual Property Office dated Apr. 19, 2024.

* cited by examiner

*Primary Examiner* — Robert A Hopkins
(74) *Attorney, Agent, or Firm* — BROADVIEW IP LAW, PC

(57) ABSTRACT
There is provided a chemical supply device for use in a semiconductor manufacturing process, the chemical supply device including a bubbler, wherein the bubbler includes: a lower support surface including a lower concave portion; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein a radius of curvature of the upper surface is greater than or equal to 45% and less than 58% of a diameter of the lower support surface.

9 Claims, 11 Drawing Sheets

10

13

12

150

11

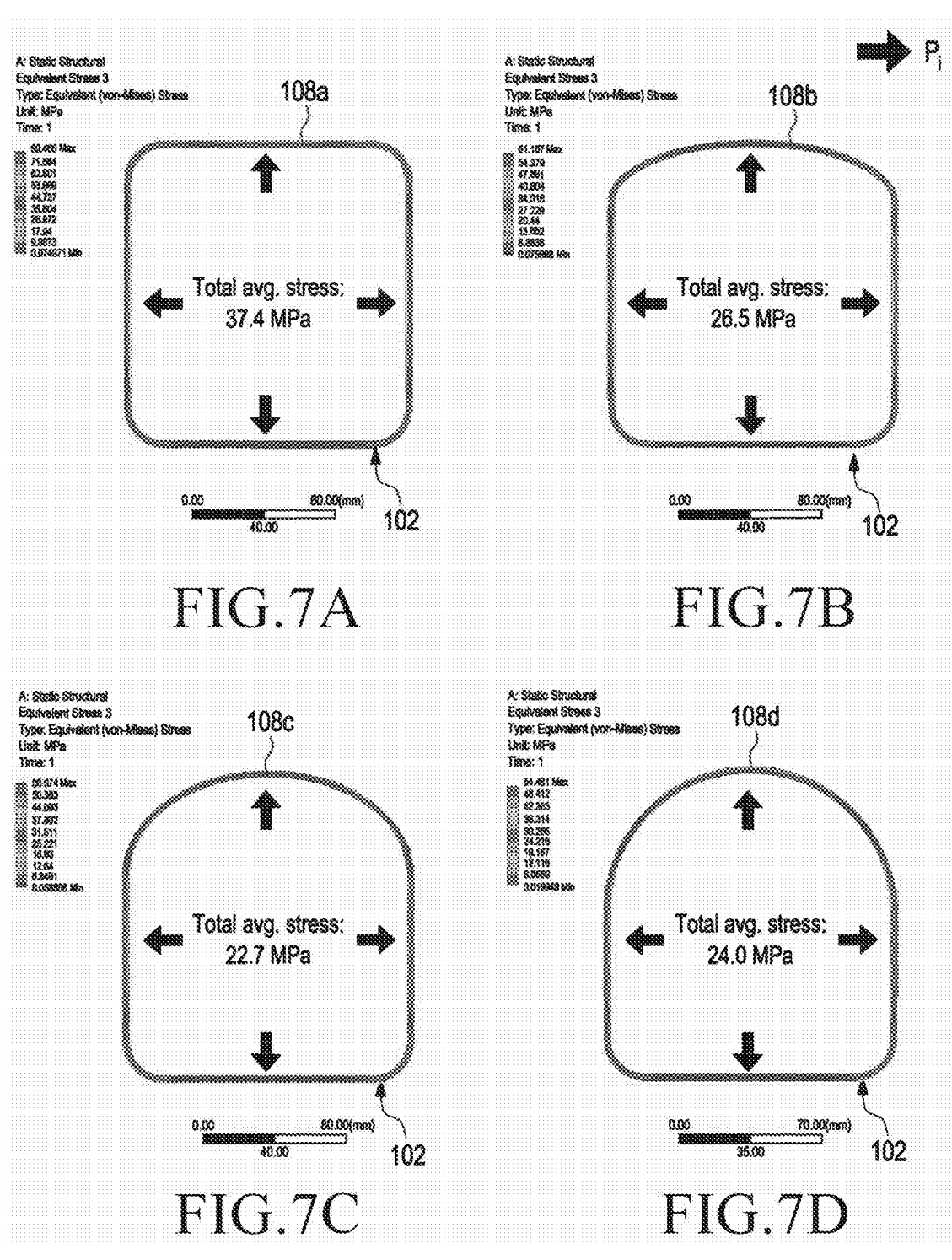
FIG.7A                        FIG.7B
FIG.7C                        FIG.7D

BUBBLER FOR USE IN SEMICONDUCTOR MANUFACTURING PROCESS

CROSS-REFERENCE TO RELATED APPLICATION(S)

This application is based on and claims priority under 35 U.S.C. § 119 to Korean Patent Application No. 10-2023-0011198, filed on Jan. 27, 2023, in the Korean Intellectual Property Office, the disclosure of which is herein incorporated by reference in its entirety.

BACKGROUND

Field

Various embodiments of the disclosure relate to a bubbler for use in a semiconductor manufacturing process.

Description of Related Art

In a semiconductor manufacturing process, a bubbler may be used to evaporate a chemical solution needed for the process. The bubbler contains a toxic chemical solution therein and evaporates the chemical solution with a fluid (for example, an inert gas) flowing thereinto.

SUMMARY

A bubbler needs to be designed to be resistant to an external pressure since it is used in a semiconductor manufacturing process performed under high pressure. In addition, the bubbler needs to be designed to be resistant to an internal pressure since a chemical solution is evaporated in the bubbler and the internal pressure rises. Accordingly, it is desired that a bubbler is designed to be resistant to both an internal pressure and an external pressure.

In addition, a bubbler is used for evaporating a chemical solution contained therein. An increase in the amount of evaporation of a chemical solution results in an increase in efficiency of a semiconductor manufacturing process. Accordingly, it is desired that a bubbler employs a structure for increasing an amount of evaporation of a chemical solution.

According to various embodiments, there is provided a chemical supply device for use in a semiconductor manufacturing process, the chemical supply device including a bubbler, wherein the bubbler includes: a lower support surface including a lower concave portion formed to be concave inward the bubbler; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein the lower concave portion has a radius of center curvature that is greater than or equal to 28% of a diameter of the lower support surface and is less than 48% of the diameter of the lower support surface in order to increase a flow velocity of the output gas sprayed from the inlet.

According to various embodiments, there is provided a chemical supply device for use in a semiconductor manufacturing process, the chemical supply device including a bubbler, wherein the bubbler includes: a lower support surface including a lower concave portion; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein a radius of curvature of the upper surface is greater than or equal to 45% and less than 58% of a diameter of the lower support surface.

According to various embodiments, by adjusting a curvature of an exterior shape, a bubbler that is resistant to an external pressure and an internal pressure may be provided.

According to various embodiments, by adjusting at least one of an arrangement angle of an inlet tube, a curvature of a bubbler, and a curvature of a lower concave portion, a bubbler with enhanced evaporation efficiency may be provided.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7A is a view illustrating a pressure inner surface of a bubbler according to various embodiments;

FIG. 7B is a view illustrating a pressure inner surface of a bubbler according to various embodiments;

FIG. 7C is a view illustrating a pressure inner surface of a bubbler according to various embodiments;

FIG. 7D is a view illustrating a pressure inner surface of a bubbler according to various embodiments;

DETAILED DESCRIPTION

Figure 1:
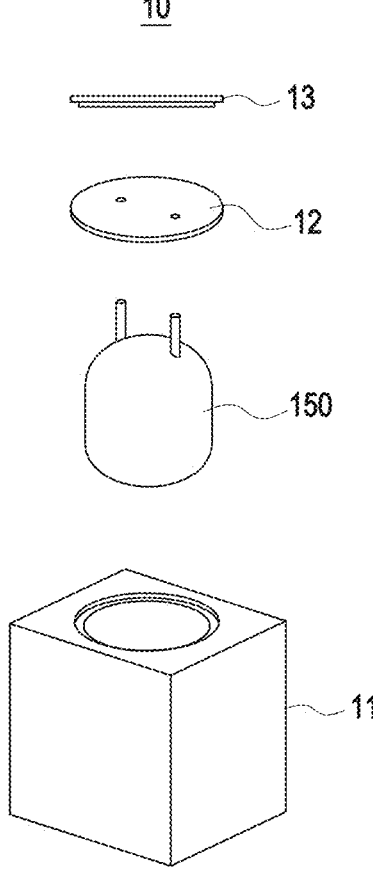
FIG. 1 is an exploded perspective view of a constant temperature bath including a bubbler according to various embodiments.

Exemplary embodiments will now be described more fully with reference to the accompanying drawings to clarify the above-described objects, features and advantages of the disclosure. However, various changes may be made to the disclosure and various embodiments may be provided, and hereinafter, specific embodiments illustrated on the drawings will be described in detail.

In the drawings, thicknesses of layers and areas are exaggerated for the sake of clarity. In addition, it will be understood that when an element or a layer is referred to as being "on" another element or layer, the element may be directly on another element or layer or an intervening element or layer interposed therebetween. Throughout the specification, the same reference numerals indicate the same elements in principle. In addition, elements having the same function within the scope of the same technical concept, illustrated on the drawings of respective embodiments, will be described by using the same reference numeral.

Detailed explanations of well-known functions or constructions related to the disclosure are omitted when it is deemed that they may unnecessarily obscure the essence of the disclosure. Numbers used in the detailed descriptions of the disclosure (for example, such terms as 'first' and 'second') are merely identification signs for distinguishing one element from another element.

The terms "area," "portion," "unit" and the terms having suffix "-er" or "-or" used in the detailed descriptions of the disclosure are given or interchangeably used only by considering easiness of drafting of the application, and do not have distinct meanings or roles in themselves.

Figure 2:
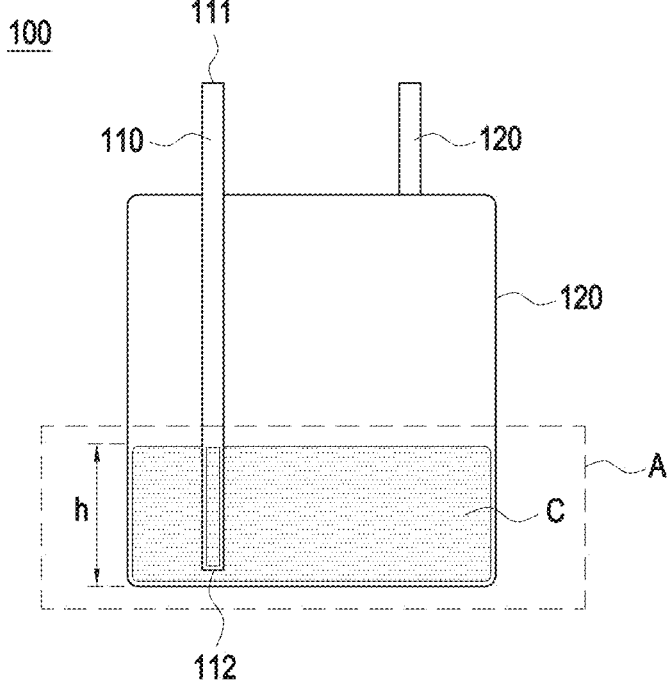
FIG. 2 is a view illustrating an example of implementation of a bubbler according to various embodiments.

FIG. 1 is an exploded perspective view of a constant temperature bath including a bubbler according to various embodiments. FIG. 2 is view illustrating an example of implementation of a bubbler according to various embodiments.

Referring to FIG. 1, a chemical supply device 10 may include all or a part of a constant temperature bath 11, a bubbler 100 disposed in the constant temperature bath 11, a cap 12 for protecting an upper portion of the bubbler 100, and a cover 13 for sealing the constant temperature bath 11.

In various embodiments, the chemical supply device 10 may be provided to supply a chemical solution C for use in a semiconductor manufacturing process to a necessary process. For example, the chemical supply device 10 may be disposed in a diffusion furnace to supply a gas to be used in a diffusion process to a wafer. In addition, the chemical supply device 10 may be provided as a reservoir to store a solid or gas and to discharge the same. In addition, the chemical supply device 10 may be disposed in other semiconductor manufacturing equipment in addition to the diffusion furnace. Explanations of the bubbler 100 presented hereinbelow are mainly about its function of containing a chemical salutation C which is a liquid and receiving a gas (for example, an inert gas) and evaporating the chemical solution C for the convenience of explanation. However, the disclosure is not limited thereto.

Referring to FIG. 2, the bubbler 100 may include a housing 101 for containing a chemical solution C, an inlet 110 connected to an inside of the housing 101 from an outside of the housing 101 to receive a gas, and an outlet 120 for discharging air evaporated in the housing 101.

According to various embodiments, an input portion 111 of the inlet 110 may be connected with a separate valve structure to receive a chemical solution C for evaporating or an inert gas N for evaporating the chemical solution C. In an embodiment, the valve structure connected with the input portion 111 may deliver a chemical solution C to the inside of the housing 101 from an external source or may receive a gas from a gas supply system and deliver the gas to the inside of the housing 101 according to a step of a semiconductor manufacturing process performed.

According to various embodiments, the inlet 110 may be extended to a lower area A inside the housing 101. In an embodiment, the inert gas N may be supplied to an injection port 112 disposed at an end of the inlet 110, and the inert gas N may induce evaporation of the chemical solution C. The inert gas N is injected with the injection port 112 being immersed in the chemical solution C, thereby directly reacting with the chemical solution C. As the chemical solution C evaporates, a remaining amount of the chemical solution C left in a liquid state is reduced. The injection port 112 may be disposed adjacent to a lower surface of the housing 101, such that the injection port 112 is still immersed in the chemical solution C even when the amount of chemical solution C is reduced.

According to various embodiments, the chemical solution evaporated inside the housing 101 may be discharged through the outlet 120. A check valve may be disposed in the outlet 120 to prevent an internal pressure of the housing 101 from rising due to the evaporated chemical solution C.

In various embodiments, the housing 101 of the bubbler 100 may be subjected to an external pressure applied in a semiconductor manufacturing process and an internal pressure applied by introduction of the inert gas and evaporation of the chemical solution C. In an embodiment, the bubbler 100 may include a quartz material. When the chemical solution C used in a semiconductor manufacturing process leaks, a damage may occur. Accordingly, employing a structure resistant to an external pressure and an internal pressure exerted to the bubbler 100 may be a means for ensuring safety of a manufacturing process.

Hereinafter, a structure of a bubbler resistant to an external pressure and an internal pressure will be described with reference to the drawings.

Figure 3A:
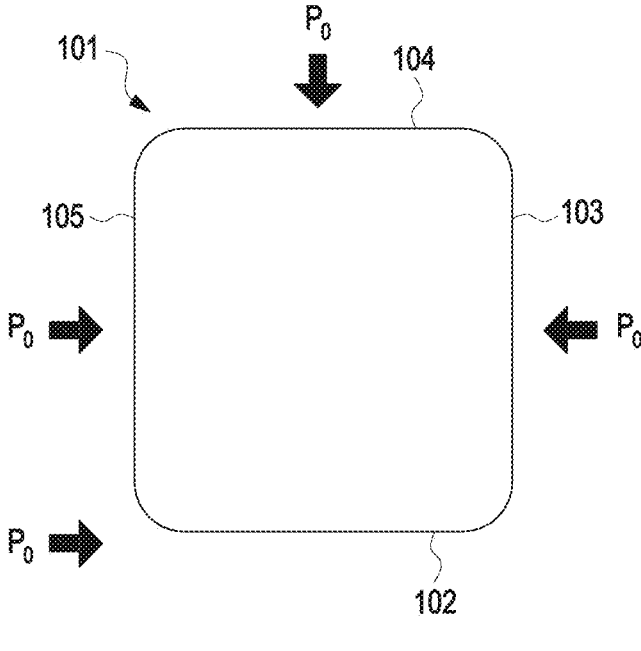
FIG. 3A is a view schematically illustrating an external pressure-resistant structure of a bubbler according to various embodiments.
Figure 3B:
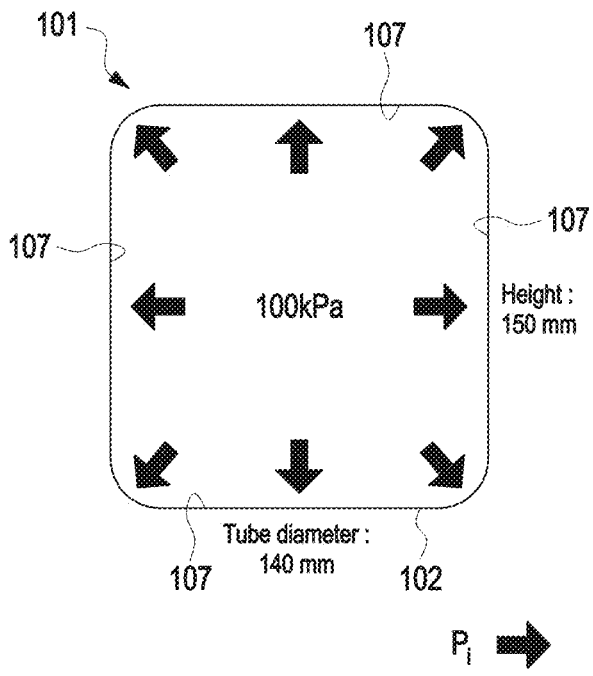
FIG. 3B is a view schematically illustrating an internal pressure-resistant structure of a bubbler according to various embodiments.

FIG. 3A is a view illustrating an external pressure-resistant structure of a bubbler 100 according to various embodiments, and FIG. 3B is a view illustrating an internal pressure-resistant structure of a bubbler 100 according to various embodiments.

According to various embodiments (referring to FIG. 3A), a housing 101 may include an upper outer surface 104, a first side outer surface 105, a second side outer surface 103, and a lower outer surface 102. In an embodiment, the lower outer surface 102 may be in contact with the constant temperature bath 10.

In an experiment regarding the external pressure-resistant structure described hereinbelow, a uniform external pressure Po was applied to the upper outer surface 104, the first side outer surface 105, and the second side outer surface 103.

According to various embodiments (referring to FIG. 3B), the housing 101 may include an inner surface 107. In an experiment regarding the internal pressure-resistant structure described below, a uniform internal pressure Pi was applied to the inner surface 107.

In addition, the lower outer surface 102 is fixed.

Figure 4:
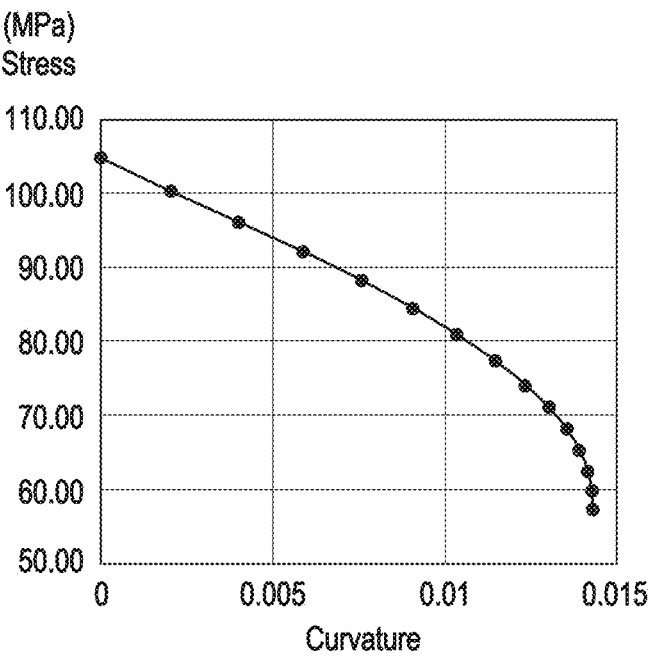
FIG. 4 is a graph showing a relationship between a curvature of a pressure outer surface of a bubbler and a stress exerted to the pressure outer surface according to various embodiments.
Figure 5:
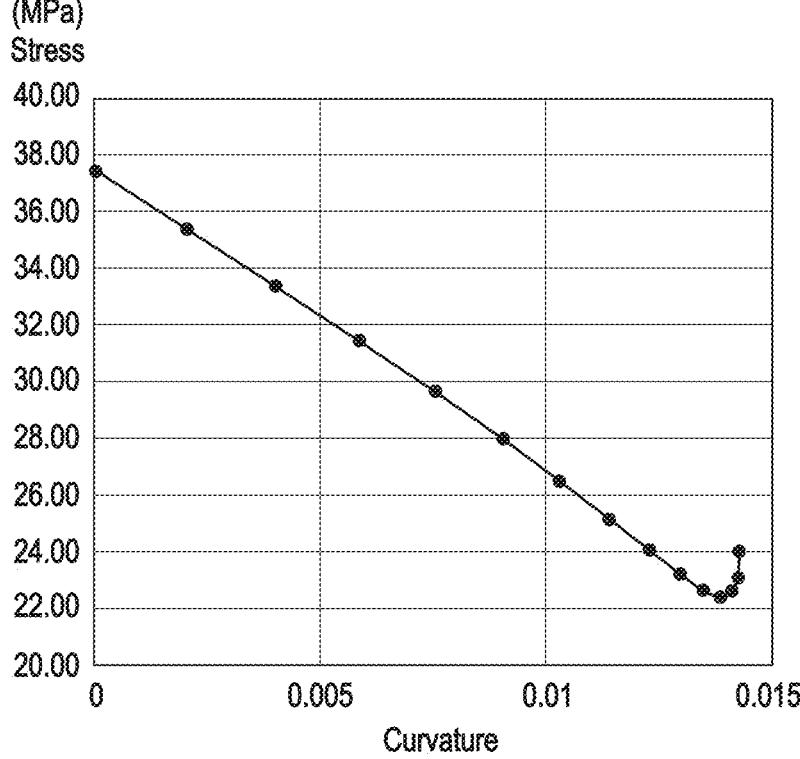
FIG. 5 is a graph showing a relationship between a curvature of a pressure inner surface of a bubbler and a stress exerted to the pressure inner surface according to various embodiments.
Figures 6A, 6B, 6C, 6D:
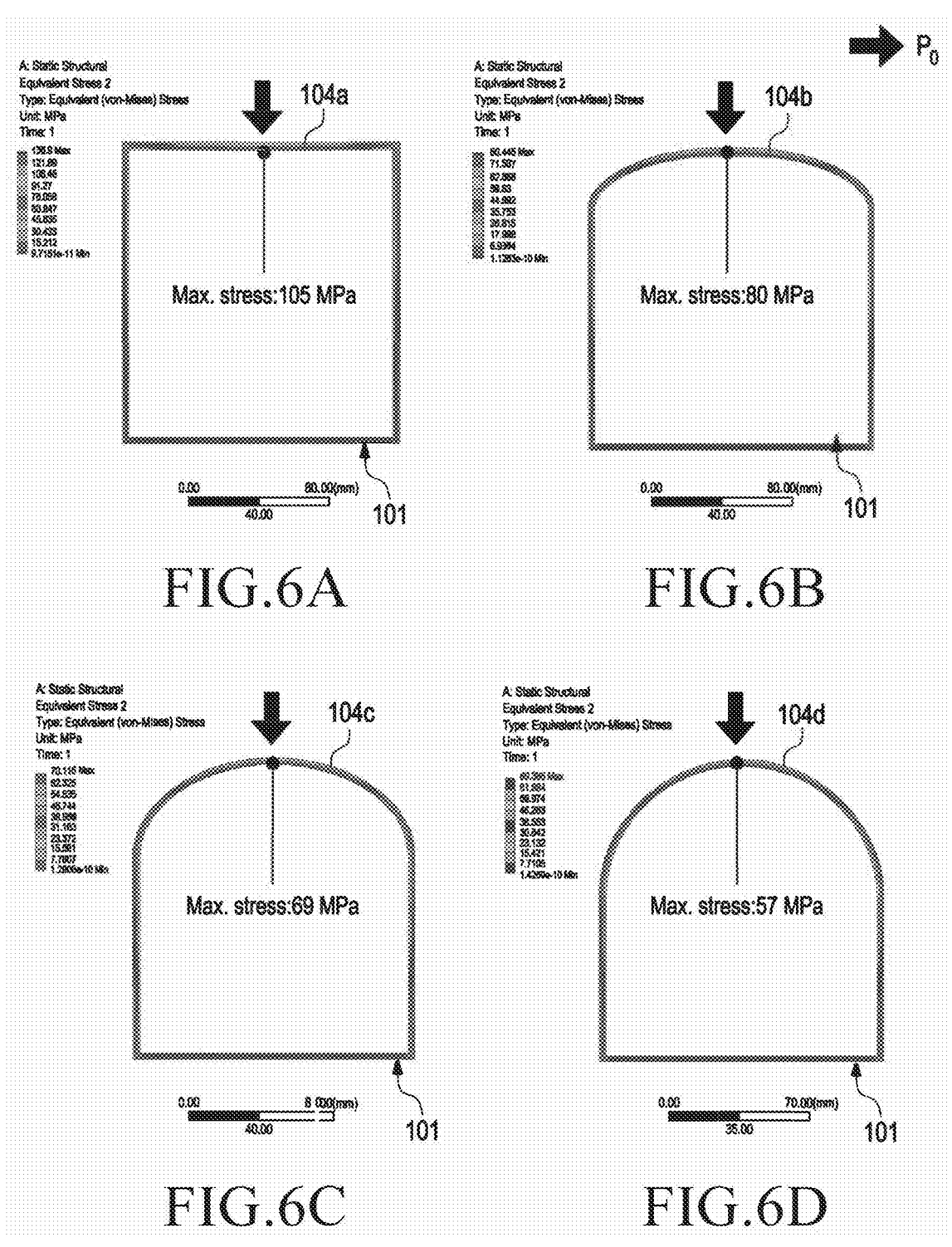
FIG. 6A is a view illustrating a pressure outer surface of a bubbler according to various embodiments.
FIG. 6B is a view illustrating a pressure outer surface of a bubbler according to various embodiments.
FIG. 6C is a view illustrating a pressure outer surface of a bubbler according to various embodiments.
FIG. 6D is a view illustrating a pressure outer surface of a bubbler according to various embodiments.

FIG. 4 is a graph showing a curvature of an upper surface and a stress exerted to the bubbler 100 when a pressure is applied to an external pressure-resistant structure, FIG. 5 is a graph showing a curvature of an upper surface and a stress exerted to the bubbler 100 when a pressure is applied to an internal pressure-resistant structure, FIG. 6A is a view illustrating an external pressure-resistant structure of the bubbler 100 according to various embodiments, FIG. 6B is a view illustrating an external pressure-resistant structure of the bubbler 100 according to various embodiments, FIG. 6C is a view illustrating an external pressure-resistant structure of the bubbler 100 according to various embodiments, FIG. 6D is a view illustrating an external pressure-resistant structure of the bubbler 100 according to various embodiments, FIG. 7A is a view illustrating an internal pressure-resistant structure of the bubbler 100 according to various embodiments, FIG. 7B is a view illustrating an internal pressure-resistant structure of the bubbler 100 according to various embodiments, FIG. 7C is a view illustrating an internal pressure-resistant structure of the bubbler 100 according to various embodiments, and FIG. 7D is a view illustrating an internal pressure-resistant structure of the bubbler 100 according to various embodiments.

In an experiment related to FIGS. 4, 5, 6A, 6B, 6C, 6D, 7A, 7B, 7C, 7D, a tensile yield strength of quartz glass was set to 160 MPa. In addition, referring to FIGS. 3A and 3B, a thickness of the housing 101 was set to 3 mm. An external pressure Po of 11 N/cm^2 was applied, and an internal pressure Pi was set to 100 kPa. Heights of the first side outer surface 103 and the second side outer surface 105 were 150 mm, and a width of the lower outer surface 102 was 140 mm.

Table 1 shows changes in a maximum stress exerted to the bubbler 100 according to a curvature of the upper outer surface 104 of the housing 101. FIG. 4 is a graph illustrating a relationship between a curvature of a pressure outer surface of a bubbler and a stress exerted to the pressure outer surface according to various embodiments. FIG. 5 is a graph illustrating a relationship between a curvature of a pressure inner surface of a bubbler and a stress applied to the pressure inner surface according to various embodiments.

TABLE 1

| Curvature | Maximum stress according to curvature | |
| | External force | Internal pressure |
| --- | --- | --- |
| 0 | 104.79 | 37.40 |
| 0.0020 | 100.36 | 35.38 |
| 0.0040 | 96.12 | 33.41 |
| 0.0059 | 92.06 | 31.50 |
| 0.0075 | 88.17 | 29.69 |
| 0.0090 | 84.45 | 28.01 |
| 0.0103 | 80.88 | 26.50 |
| 0.0114 | 77.46 | 25.18 |
| 0.0123 | 74.19 | 24.09 |
| 0.0130 | 71.06 | 23.25 |
| 0.0135 | 68.06 | 22.70 |
| 0.0139 | 65.18 | 22.47 |
| 0.0141 | 62.43 | 22.59 |
| 0.0142 | 59.79 | 23.09 |
| 0.0143 | 57.27 | 24.00 |

The disclosure will be described with reference to Table 1, FIG. 4 and FIG. 5.

According to various embodiments, the maximum stress occurring due to an external force applied to the bubbler 100 decreases as the curvature of the upper outer surface 104 increases. Specifically, the maximum stress occurring due to the external force applied to the bubbler 100 substantially linearly decreases within the range of the curvature of the upper outer surface 104 from 0 to 0.0123, and the maximum stress nonlinearly decreases from the range of the curvature of the upper outer surface 104 of 0.0123 or greater.

According to various embodiments, the curvature of the upper outer surface 104 may be determined such that the maximum stress occurring due to the external force Po applied to the bubbler 100 is less than 50% of the tensile yield strength. For example, considering that the tensile yield strength is 160 MPa in the case of the bubbler 100 of the quartz material, it is desired that the curvature of the upper outer surface 104 is larger than 0.0114.

According to various embodiments, the curvature of the upper outer surface 104 may be set to a range in which the maximum stress occurring due to the external force Po nonlinearly decreases. For example, when the curvature of the upper outer surface 104 is greater than or equal to 0.0123, the maximum stress exerted to the bubbler 100 may nonlinearly and abruptly decrease, so that the bubbler can be prevented from being damaged by the external force Po.

According to various embodiments, the maximum stress occurring due to an internal pressure Pi applied to the bubbler 100 may also decrease as the curvature of the upper outer surface 104 and/or the upper inner surface 107 increases. Specifically, as the curvature of the upper outer surface 104 increases, the maximum stress exerted to the bubbler 100 substantially linearly decreases. Herein, the maximum stress occurring due to the internal pressure Pi applied to the bubbler 100 rises again starting from the curvature of the upper outer surface 104 of 0.0139.

According to various embodiments, it is desired that the curvature of the upper outer surface 104 is determined to be less than or equal to 0.0139 to reduce the maximum stress occurring due to the internal pressure Pi applied to the bubbler 100. When the curvature of the upper outer surface 104 is determined to be greater than or equal to 0.0139, the maximum stress occurring due to the internal pressure Pi rises again and thus efficiency of the internal pressure resistant structure may be degraded. Herein, the curvature of the upper outer surface 104 of 0.0139 may be defined as a threshold curvature for the internal pressure Pi.

According to various embodiments, considering both the external force Po and the internal pressure Pi applied to the bubbler 100, the curvature of the upper outer surface 104 may have a range from 0.0114 to 0.0139. When the curvature of the upper outer surface 104 has a range from 0.0114 to 0.0139, the maximum stress occurring due to the external force Po may decrease to be less than 50% of the tensile yield strength of the bubbler 100 of the quartz material, and the maximum stress occurring due to the internal pressure Pi may also decrease, so that the bubbler 100 can be resistant to both the external force Po and the internal pressure Pi.

FIG. 6A illustrates an external pressure-resistant structure of the bubbler according to various embodiments, FIG. 6B illustrates an external pressure-resistant structure of the bubbler according to various embodiments, FIG. 6C illustrates an external pressure-resistant structure of the bubbler according to various embodiments, and FIG. 6D illustrates an external pressure-resistant structure of the bubbler according to various embodiments. FIG. 7A illustrates an internal pressure-resistant structure of the bubbler according to various embodiments, FIG. 7B illustrates an internal pressure-resistant structure of the bubbler according to various embodiments, FIG. 7C illustrates an internal pressure-resistant structure of the bubbler according to various embodiments, and FIG. 7D illustrates an internal pressure-resistant structure of the bubbler according to various embodiments.

Referring to FIGS. 6A, 6B, 6C, 6D, 7A, 7B, 7C, 7D, maximum stresses to an external force Po and an internal pressure Pi according to changes in an upper outer surface 104a, 104b, 104c, 104d and an upper inner surface 108a, 108b, 108c, 108d are illustrated.

FIG. 6A illustrates a first upper outer surface 104a, FIG. 6B illustrates a second upper outer surface 104b, FIG. 6C illustrates a third upper outer surface 104c, and FIG. 6D illustrates a fourth upper outer surface 104d. The first upper outer surface 104a has a curvature of 0, the second upper outer surface 104b has a curvature of 0.0103, the third upper outer surface 104c has a curvature of 0.0133, and the fourth upper outer surface 104d has a curvature of 0.0143. As the curvature increases from the first upper outer surface 104a to the fourth upper outer surface 104d, the maximum stress exerted to the upper outer surfaces 104a, 104b, 104c, 104d decreases as described above.

FIG. 7A illustrates a first upper inner surface 108a, FIG. 7B illustrates a second upper inner surface 108b, FIG. 7C illustrates a third upper inner surface 108c, and FIG. 7D illustrates a fourth upper inner surface 108d. As the curvature of the upper inner surface increases, the maximum stress occurring due to the internal pressure Pi decreases as described above.

However, as the curvature increases, the shape of the bubbler 100 may be changed. In order to minimize a change in the shape of the bubbler 100, a small curvature is required to be selected. There is a need for a structure of the bubbler 100 that is resistant to an internal pressure Pi and an external force Po with a small change in the shape of the bubbler 100.

According to various embodiments, the curvature of the upper outer surface 104 and/or the upper inner surface 108 may be determined considering all or a part of a change in the shape of the bubbler 100, a maximum stress occurring due to the internal pressure Pi and a maximum stress occurring due to the external pressure Po. In an embodiment, in order to minimize a change in the shape of the bubbler 100, a radius of curvature may be determined to be greater than or equal to 45% of the width of the lower outer surface 102. For a curvature determined considering the internal pressure Pi and the external force Po, the contents of the above-described embodiments may be applied.

According to various embodiments, considering all of a change in the shape of the bubbler 100, the maximum stress occurring due to the internal pressure Pi and the maximum stress occurring due to the external force Po, the curvature of the upper outer surface 104 and/or the upper inner surface 108 may be determined to be about 0.0139. When the curvature is 0.0139, the radius of curvature may be about 48% of the width of the lower outer surface 102 and a change in the shape of the bubbler 100 may be reduced, and also, the maximum stress occurring due to the internal pressure Pi may be minimized.

In a certain embodiment, the curvature of the upper outer surface 104 and/or the upper inner surface 108 may be determined to be about 0.011 to 0.0139. As described above, when the curvature is 0.011, a maximum stress of less than 50% of the tensile yield strength of the bubbler 100 of the quartz material is exerted such that the bubbler is resistant to the external force Po and the internal pressure Pi, and the radius of curvature is close to about 60% of the width of the lower outer surface 102, such that the change in the shape of the bubbler 100 is reduced.

Hereinafter, a bubbler structure that reduces a remaining amount of the chemical solution C remaining in the bubbler 100 after a bubbling process, and enhances bubbling efficiency will be described with reference to the drawings.

Figures 8A, 8B, 8C, 8D:
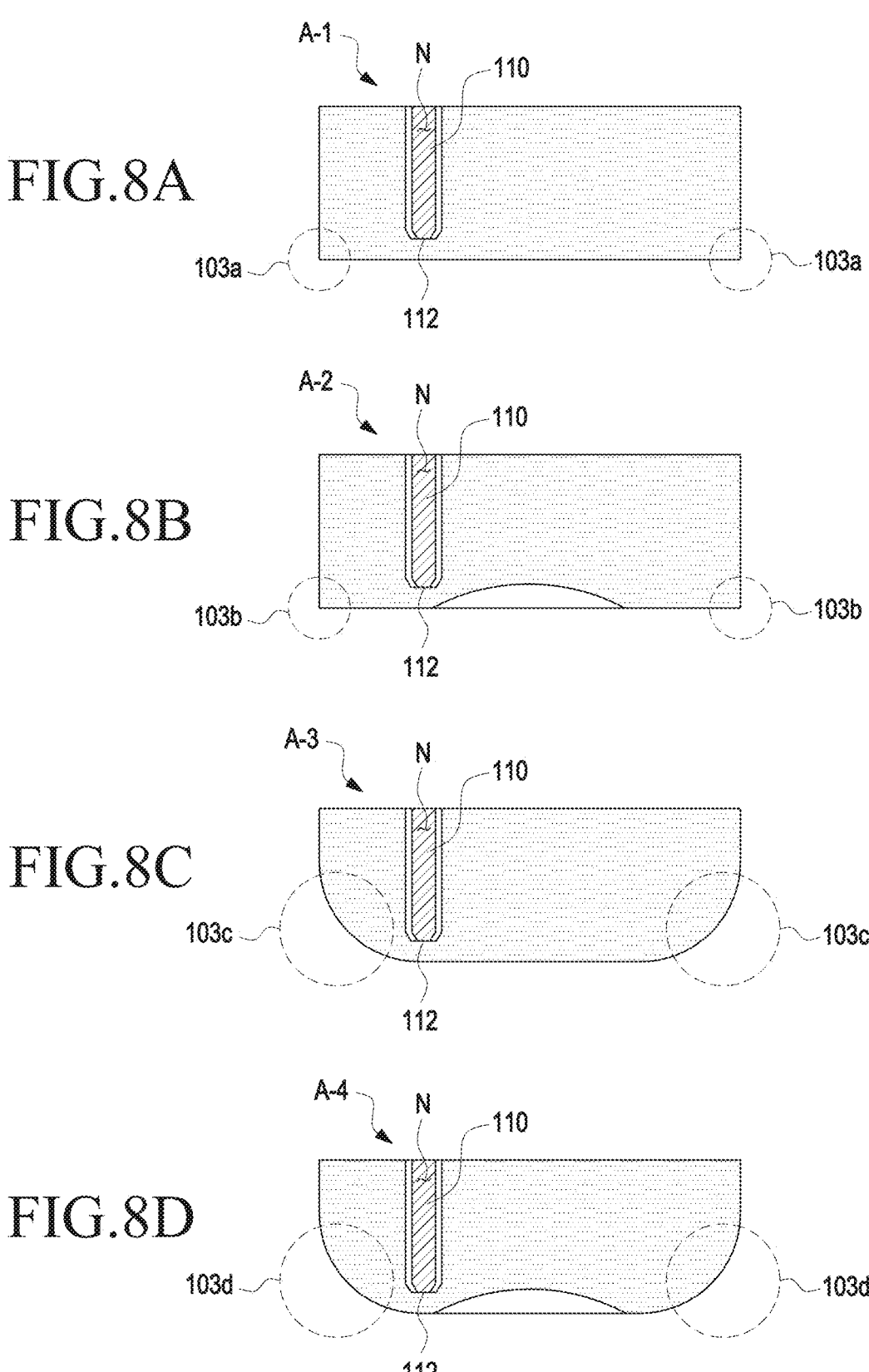
FIG. 8A is a view illustrating an evaporation structure of a bubbler according to various embodiments.
FIG. 8B is a view illustrating an evaporation structure of a bubbler according to various embodiments.
FIG. 8C is a view illustrating an evaporation structure of a bubbler according to various embodiments.
FIG. 8D is a view illustrating an evaporation structure of a bubbler according to various embodiments.

FIG. 8A illustrates an evaporation structure of the bubbler according to various embodiments, FIG. 8B illustrates an evaporation structure of the bubbler according to various embodiments, FIG. 8C illustrates an evaporation structure of the bubbler according to various embodiments, and FIG. 8D illustrates an evaporation structure of the bubbler according to various embodiments. The area A of FIG. 1 is illustrated in FIGS. 8A, 8B, 8C, 8D.

Referring to FIGS. 8A, 8B, 8C, 8D, an evaporation structure of the bubbler 100 may include all or a part of an inlet 110, an injection port 112 formed at an end of the inlet 110, a corner curved portion 103, and a lower concave portion 103-1.

According to various embodiments, evaporation in the bubbler 100 may be performed by an output gas N outputted from the inlet 110. As a flow velocity of the output gas N increases, evaporation efficiency of the chemical solution C may be enhanced.

A result of an experiment will be described with reference to tables 2, 3, 4, and FIGS. 8A, 8B, 8C, 8D. In the experiment of tables 2, 3, 4, an input speed of the output gas N was set to 1 m/s, a capacity of the bubbler 100 was set to 1200 cc, a diameter was set to 140 mm, and a height was set to 150 mm.

TABLE 2

| Outer Curvature | Maximum velocity |
|---|---|
| 0.0000 | 2.818 |
| 0.1250 | 2.894 |
| 0.0625 | 3.007 |
| 0.0417 | 3.211 |
| 0.0313 | 3.272 |

Table 2 shows flow velocities of the output gas N according to changes in the curvature of the corner curved portion.

According to various embodiments, when the bubbler includes a curved surface such as a third corner curved portion 103c and a fourth corner curved portion 103d, the flow velocity of the output gas N sprayed through the injection port 112 may be faster than when the bubbler does not include a curved surface like a first corner curved portion 103a. In addition, in an embodiment, as the curvature of the corner curved portion 103c, 103d increases, the flow velocity of the output gas N may increase.

Table 3 shows flow velocities of the output gas N according to changes in the curvature of the lower concave portion.

According to various embodiments, the bubbler 100 may include the lower concave portion 103-1a, 103-1b. The lower concave portion 103-1a, 103-1b may increase the flow velocity of the output gas N spayed through the injection port 112.

As shown in FIG. 8D, the bubbler may include both the corner curved portion 103d and the lower concave portion 103-1b in order to maximize the flow velocity of the output gas N. In addition, an increased curvature of the corner curved portion 103c, 103d and/or an increased curvature of the lower concave portion 103-1a, 103-1b may be used to increase the flow velocity of the output gas N.

Figures 9A, 9B, 9C, 9D, 9E:
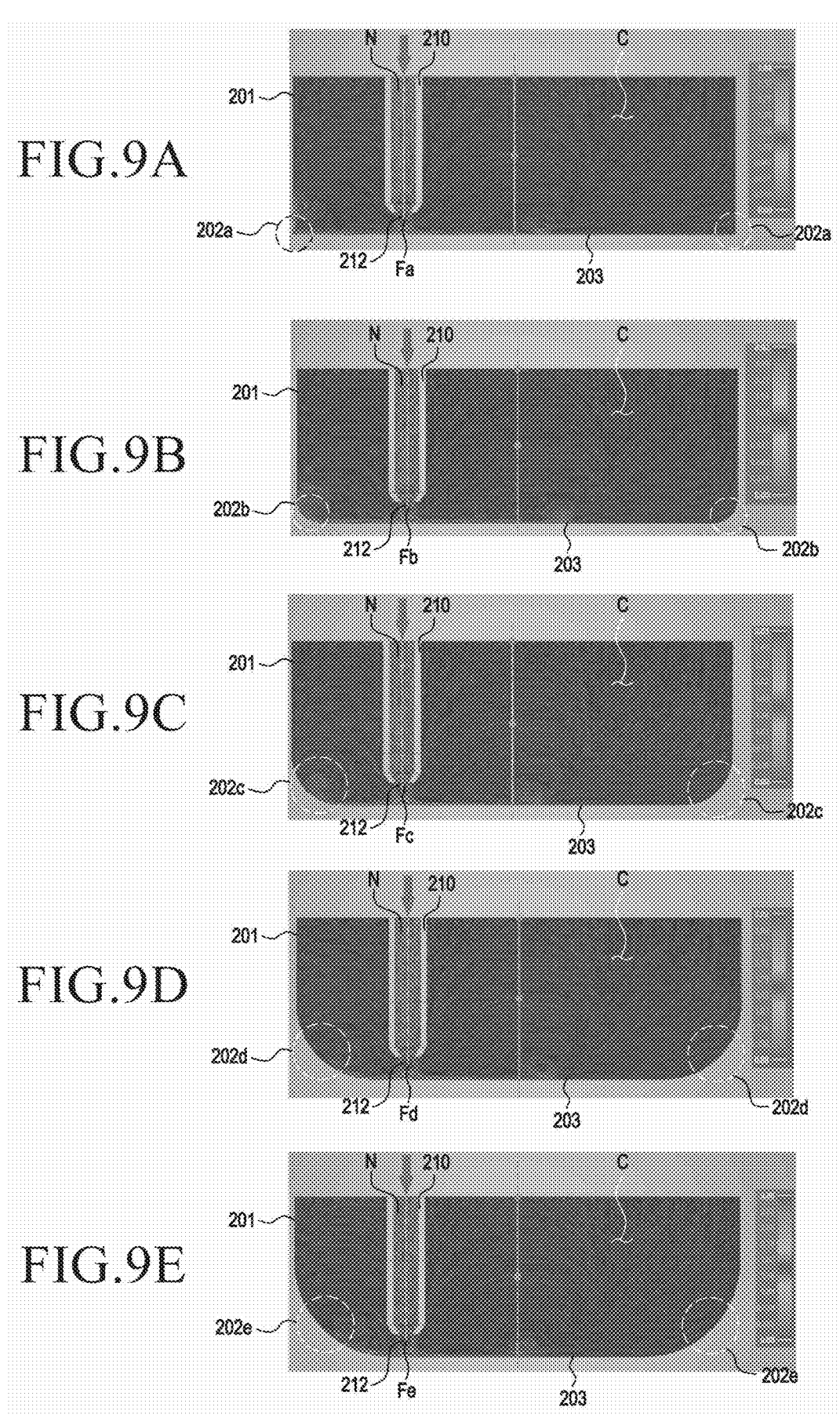
FIG. 9A is a view illustrating a change in an amount of evaporation according to a change in an evaporation structure according to various embodiments.
FIG. 9B is a view illustrating a change in an amount of evaporation according to a change in an evaporation structure according to various embodiments.
FIG. 9C is a view illustrating a change in an amount of evaporation according to a change in an evaporation structure according to various embodiments.
FIG. 9D is a view illustrating a change in an amount of evaporation according to a change in an evaporation structure according to various embodiments.
FIG. 9E is a view illustrating a change in an amount of evaporation according to a change in an evaporation structure according to various embodiments.

FIG. 9A illustrates a change in the amount of evaporation according to a change in the curvature of a corner curved portion according to various embodiments, FIG. 9B illustrates a change in the amount of evaporation according to a change in the curvature of a corner curved portion according to various embodiments, FIG. 9C illustrates a change in the amount of evaporation according to a change in the curvature of a corner curved portion according to various embodiments, FIG. 9D illustrates a change in the amount of evaporation according to a change in the curvature of a corner curved portion according to various embodiments, and FIG. 9E illustrates a change in the amount of evaporation according to a change in the curvature of a corner curved portion according to various embodiments.

Referring to FIGS. 9A, 9B, 9C, 9D, 9E, it is illustrated that as the curvature of the corner curved portion 202a, 202b, 202c, 202d, 202e increases, the flow velocity Fa, Fb, Fc, Fd, Fe of the output gas N increases.

In an embodiment, when the curvature of the corner curved portion 202e was 0.0313, the highest flow velocity Fe of the output gas N, 3.28 m/s, was measured. The flow velocity increased by 11% compared to the case where the corner curved portion 202e was not formed.

According to various embodiments, when the curvature of the corner curved portion 202a, 202b, 202c, 202d, 202e increases, the flow velocity Fa, Fb, Fc, Fd, Fe of the output gas N increases, but a shape of the lower portion of the bubbler 100 is deformed. When the curvature excessively increases, a support surface 203 of the lower portion of the bubbler 100 becomes smaller, making it the disposition of the bubbler 100 unstable. Accordingly, it is desired that the radius of curvature of the corner curved portion 202a, 202b, 202c, 202d, 202e is set to be greater than or equal to 20% of a diameter of the lower portion of the bubbler 100.

Figures 10A, 10B, 10C, 10D:
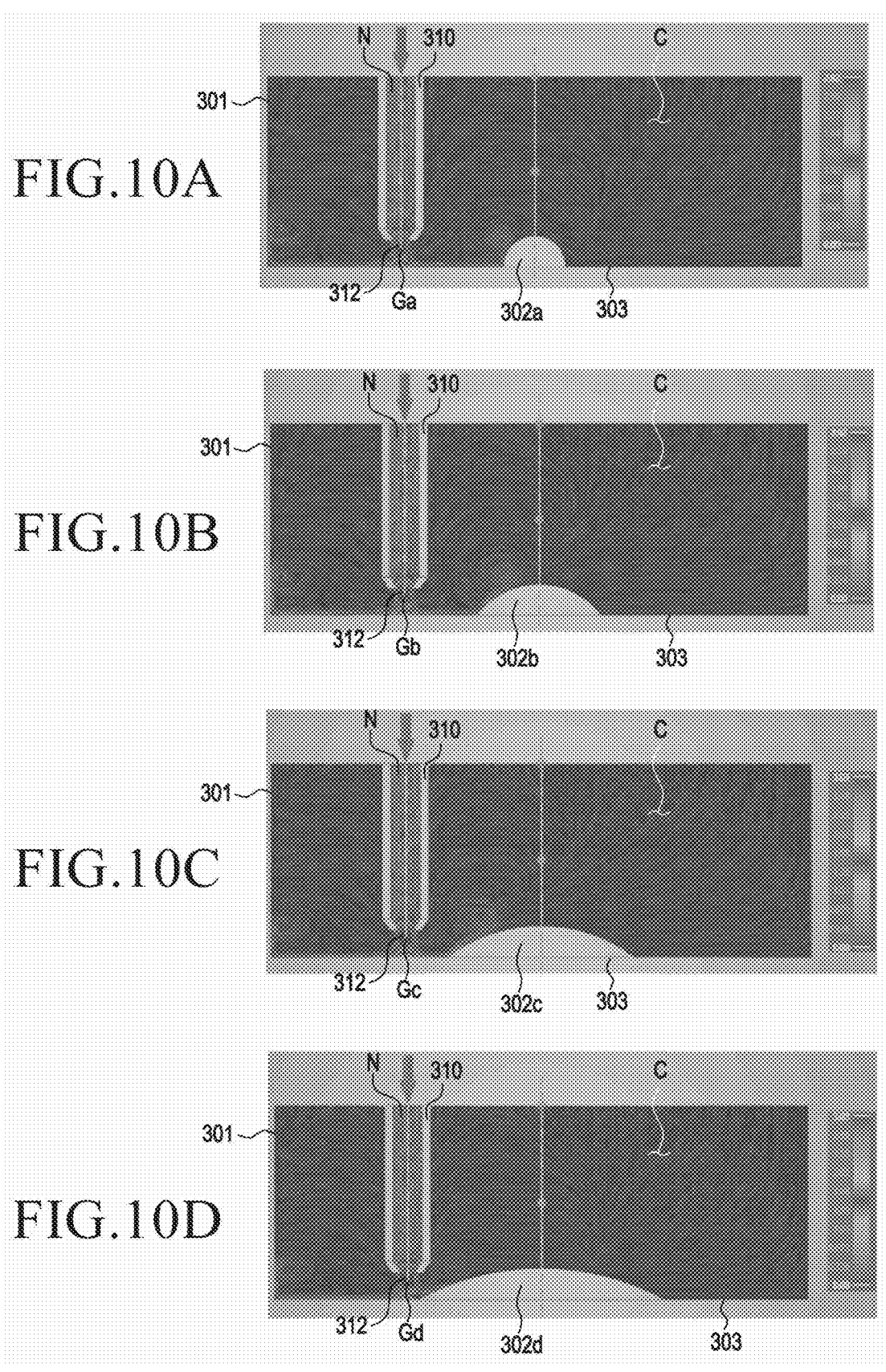
FIG. 10A is a view illustrating a change in an amount of evaporation according to a change in an evaporation structure according to another embodiment.
FIG. 10B is a view illustrating a change in an amount of evaporation according to a change in an evaporation structure according to another embodiment.
FIG. 10C is a view illustrating a change in an amount of evaporation according to a change in an evaporation structure according to another embodiment.
FIG. 10D is a view illustrating a change in an amount of evaporation according to a change in an evaporation structure according to another embodiment.

FIG. 10A illustrates a change in the amount of evaporation according to a change in the curvature of a lower concave portion according to another embodiment, FIG. 10B illustrates a change in the amount of evaporation according to a change in the curvature of a lower concave portion according to another embodiment, FIG. 10C illustrates a change in the amount of evaporation according to a change in the curvature of a lower concave portion according to another embodiment, and FIG. 10D illustrates a change in the amount of evaporation according to a change in the curvature of a lower concave portion according to another embodiment.

Referring to FIGS. 10A, 10B, 10C, 10D and table 3 presented below, there is no trend that the flow velocity Ga, Gb, Ge, Gd of the output gas N simply increases as the curvature of the lower concave portion 302a, 302b, 302c, 302d increases, which is different from the case of the corner curved portion 202a, 202b, 202c, 202d, 202e of FIGS. 9A, 9B, 9C, 9D, 9E.

In an embodiment, when the curvature of the lower concave portion 302d was 0.0250, the flow velocity Fe of the output gas N measured 3.007 m/s, and, when the curvature was 0.0147, the highest flow velocity, 3.006 m/s, was measured. The flow velocity increased by about 7% compared to the case where the lower concave portion 302d was not formed.

TABLE 3

| Center Curvature | Maximum Velocity |
|---|---|
| 0.0000 | 2.818 |
| 0.1250 | 2.894 |
| 0.0500 | 2.894 |
| 0.0250 | 3.007 |
| 0.0147 | 3.006 |

Table 3 shows changes in the flow velocity of the output gas N according to changes in the center curvature of the lower concave portion.

According to various embodiments, as an area occupied by the lower concave portion 302a, 302b, 302c, 302d increases, a volume of an area containing the chemical solution C in the bubbler 100 may be reduced. Accordingly, it is desired that the curvature of the lower concave portion 302a, 302b, 302c, 302d is set to increase the flow velocity Ga, Gb, Gc, Gd of the output gas N and to increase a volume of the inside of the bubbler 100. In an embodiment, when the curvature of the lower concave portion 302d is 0.0147, the flow velocity Gd of the output gas N may be maximized and the volume of the inside of the bubbler 100 may also increase. In addition, even when the curvature of the lower concave portion 302d is 0.0250, a similar effect occurs as when the curvature is 0.0147. Accordingly, the curvature of the lower concave portion 302d may be determined to be 0.0147 to 0.0250.

Figures 11A, 11B, 11C, 11D:
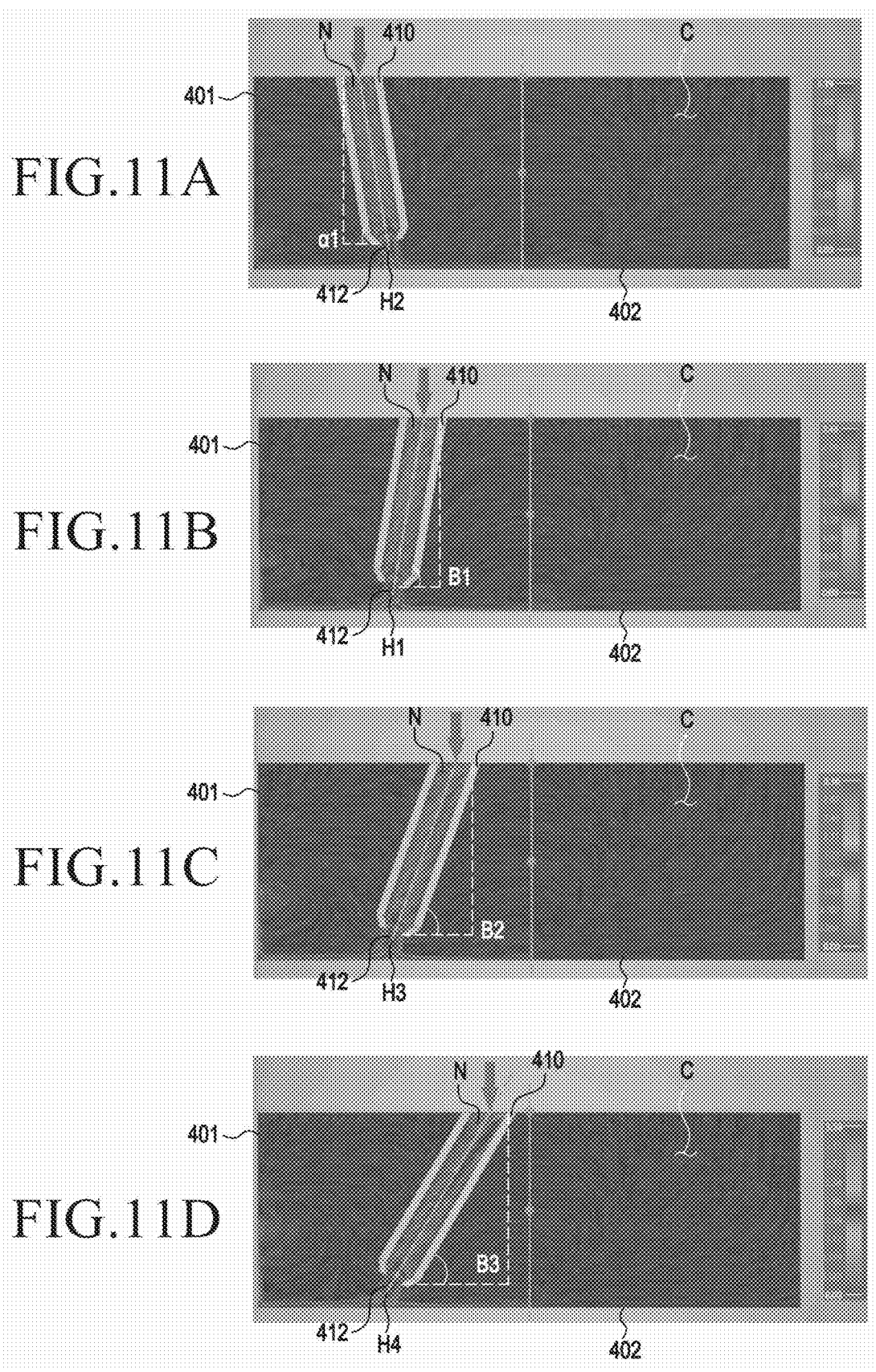
FIG. 11A is a view illustrating a change in an amount of evaporation according to a change in an evaporation structure according to still another embodiment.
FIG. 11B is a view illustrating a change in an amount of evaporation according to a change in an evaporation structure according to still another embodiment.
FIG. 11C is a view illustrating a change in an amount of evaporation according to a change in an evaporation structure according to still another embodiment.
FIG. 11D is a view illustrating a change in an amount of evaporation according to a change in an evaporation structure according to still another embodiment.

FIG. 11A illustrates a change in the amount of evaporation according to a change in the arrangement angle of the inlet according to still another embodiment, FIG. 11B illustrates a change in the amount of evaporation according to a change in the arrangement angle of the inlet according to still another embodiment, FIG. 11C illustrates a change in the amount of evaporation according to a change in the arrangement angle of the inlet according to still another embodiment, and FIG. 11D illustrates a change in the amount of evaporation according to a change in the arrangement angle of the inlet according to still another embodiment. Table 4 illustrates flow velocities of the output gas according to changes in the arrangement angle of the inlet.

TABLE 4

| Tube Angle (°) | Maximum Velocity (m/s) |
|---|---|
| −80 | 3.154 |
| 90 | 2.818 |
| 80 | 3.095 |
| 70 | 3.12 |
| 60 | 3.484 |

Referring to FIGS. 11A, 11B, 11C, 11D and table 4, the flow velocity H1, H2, H3, H4 of the output gas N may change according to the arrangement angle of the inlet 410.

According to various embodiments, the flow velocity of the output gas N increases as the arrangement angle of an inlet 410 to a lower surface 402 increases. For example, the flow velocity of the output gas N increases as an injection port 412 is more parallel to the lower surface 402.

In a certain embodiment, an upper area of the inlet 410 may be disposed to be inclined toward a side of a housing 401 (see FIG. 11A). In this case, the flow velocity of the output gas N was measured as faster than when the upper area of the inlet 410 was disposed to be inclined toward the center of the housing 401 (see FIG. 11B). When the inlet 410 is disposed as shown in FIG. 11A, the arrangement angle a1 may be determined to be 80° to 90° to overcome spatial constraints.

In an embodiment (see FIGS. 11B, 11C, 11D), the flow velocity H2, H3, H4 of the output gas N may increase when the arrangement angle B1, B2, B3 of the inlet 410 increases. However, there is a need to overcome spatial constraints in the housing 401. Accordingly, the arrangement angle of the inlet 410 may be determined to be 60° to 80° to increase the flow velocity of the output gas N while overcoming spatial constraints in the housing 410.

Figure 12:
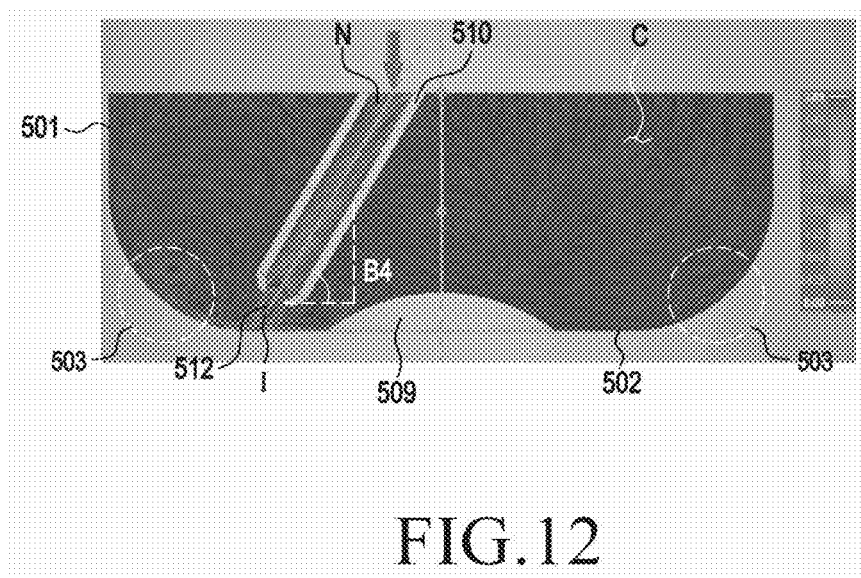
FIG. 12 is a view illustrating an evaporation structure and an amount of evaporation according to various embodiments.

FIG. 12 illustrates an evaporation structure and an amount of evaporation according to various embodiments.

Referring to FIG. 12, an evaporation structure for maximizing a flow velocity N of an output gas N is illustrated.

The evaporation structure of FIG. 12 is a synthesis of embodiments of FIGS. 8A, 8B, 8C, 8D, 9A, 9B, 9C, 9D, 9E, 10A, 10B, 10C, 10D, 11A, 11B, 11C, 11D.

According to various embodiments, the optimal evaporation structure includes both a corner curved portion 503 and a lower concave portion 509, and an inlet 510 may be disposed to be inclined relative to a lower surface 502. In an embodiment, the curvature of the corner curved portion 503 was set to 0.0313 and the center curvature of the lower concave portion 509 was set to 0.147. Herein, the arrangement angle of the inlet 510 was set to 60°.

In an embodiment, in the evaporation structure of FIG. 12, the flow velocity of the output gas N measured 3.773 m/s. The flow velocity increased by 34% compared to the case where the corner curved portion, the lower concave portion were formed as shown in FIG. 8A or 9A, and the arrangement angle of the inlet was 90°.

The optimal evaporation structure illustrated in FIG. 12 is merely a part of various embodiments of the disclosure. It will be understood that various changes may be made to the structure to increase the flow velocity of the output gas N according to an appropriate combination of various experiments in the disclosure.

Referring to FIGS. 8A, 8B, 8C, 8D and table 5, an interior structure of the bubbler 100 to reduce a remaining amount of the chemical solution C will be described. In explaining, reference may be made to the area A of FIG. 1. Table 5 shows a remaining amount of the chemical solution C according to the evaporation structure of FIGS. 8A, 8B, 8C, 8D.

TABLE 5

| | Evaporation structure | | | |
|---|---|---|---|---|
| | (A) | (B) | (C) | (D) |
| Remaining amount | 767 cc | 680 cc | 754 cc | 667 cc |

In the experiment of table 5, the height (h, see FIG. 2) of the chemical solution was set to 50 mm and the volume of the chemical solution C was set to 1200 cc.

According to various embodiments, when the bubbler included both the corner curved portion 103d and the lower concave portion 103-1b (see FIG. 8D), the lowest remaining amount of the chemical solution was measured. In an embodiment, when the bubbler included the corner curved portion 103a and/or included the lower concave portion 103-1a, 103-1b, the remaining amount of the chemical solution C measured was smaller than when the bubbler did not include both (see FIG. 8A).

In an embodiment, in order to reduce the remaining amount of the chemical solution C, the curvature of the corner curved portion 103d may be determined to be 0.031 and/or the center curvature of the lower concave portion 103-1b may be determined to be 0.015.

According to various embodiments, there is provided a chemical supply device for use in a semiconductor manufacturing process, the chemical supply device including a bubbler, wherein the bubbler includes: a lower support surface comprising a lower concave portion; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein a radius of curvature of the upper surface is greater than or equal to 45% and less than 58% of a diameter of the lower support surface.

According to an embodiment, the bubbler may be a quartz bubbler, the bubbler may have a thickness of 3 mm, and the radius of curvature of the upper surface may be determined such that a stress exerted to the upper surface is less than 50% of a tensile yield strength of the quartz bubbler when an external force of 11 N/cm^2 is applied from an outside of the quartz bubbler.

According to an embodiment, the curvature of the upper surface may be greater than or equal to 0.0114 and less than 0.0139 when the diameter of the lower support surface is 140 mm and an internal pressure of 100 kPa is applied inside the quartz bubbler.

According to an embodiment, the lower support surface may further include the lower concave portion formed on a center area of the lower surface to be concave inward the bubbler.

According to an embodiment, in order to reduce a remaining amount of the chemical solution, the lower concave portion has a curvature of 0.015 to 0.030 when the diameter of the lower support surface is 140 mm.

According to an embodiment, the corner curved portion may have a curvature of 0.025 to 0.035 in order to reduce a remaining amount of the chemical solution.

According to an embodiment, the chemical supply device may further include a constant temperature bath configured to accommodate the bubbler and to maintain a temperature of the chemical solution in the bubbler.

According to an embodiment, the chemical supply device may further include a valve structure configured to transmit the output gas to the inlet from a gas system.

According to an embodiment, the output gas may include a nitrogen gas.

According to an embodiment, the evaporated chemical solution may be transmitted to a diffusion furnace.

According to various embodiments, there is provided a chemical supply device for use in a semiconductor manufacturing process, the chemical supply device including a bubbler, wherein the bubbler includes: a lower support surface comprising a lower concave portion formed to be concave inward the bubbler; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein the lower concave portion has a radius of center curvature that is greater than or equal to 28% of a diameter of the lower support surface and is less than 48% of the diameter of the lower support surface in order to increase a flow velocity of the output gas sprayed from the inlet.

According to an embodiment, the bubbler may be a quartz bubbler, and the corner curved portion may have a curvature that is less than or equal to 23% of the diameter of the lower support surface.

According to an embodiment, the inlet may be disposed to have a predetermined angle with respect to the lower support surface to increase the flow velocity of the output gas, and the predetermined angle may be 60° to 80° inclusive.

According to an embodiment, in order to reduce a remaining amount of the chemical solution, the lower concave portion has a curvature of 0.015 to 0.030 when the diameter of the lower support surface is 140 mm.

According to an embodiment, the corner curved portion may have a curvature of 0.025 to 0.035 in order to reduce the remaining amount of the chemical solution.

According to an embodiment, the chemical supply device may further include a constant temperature bath configured to accommodate the bubbler and to maintain a temperature of the chemical solution in the bubbler.

According to an embodiment, the chemical supply device may further include a valve structure configured to transmit the output gas to the inlet from a gas system.

According to an embodiment, the output gas may include a nitrogen gas.

According to an embodiment, the evaporated chemical solution may be transmitted to a diffusion furnace.

According to various embodiments, there is provided an optimal bubbler structure with enhanced evaporation efficiency, the optimal bubbler structure including: a lower support surface including a lower concave portion formed to be concave inward the bubbler; a side surface smoothly connected to the lower support surface through a corner curved portion; an upper surface extended from the side surface; an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein, in order to increase a flow velocity of the output gas sprayed from the inlet, the lower concave portion has a radius of center curvature that is greater than or equal to 48% and less than 49% of a diameter of the lower support surface, the corner curved portion has a radius of curvature that is greater than or equal to 22% and less than 23% of the diameter of the lower support surface, and the inlet is disposed to have an angle of 60° with respect to the lower support surface.

Although the embodiments have been described with reference to specified embodiments and drawings as described above, various modifications and changes may be made from the above descriptions by a person skilled in the art. For example, even when the above-described technologies are performed in a different order from that described above, and/or components of the above-described structure, device, etc. are coupled or combined in different forms from that described above, or are replaced or substituted with other components or equivalents, appropriate results may be achieved.

Therefore, other implementations, other embodiments, and equivalents to the scope of the claims belong to the scope of the claims presented below.

What is claimed is:

1. A chemical supply device for use in a semiconductor manufacturing process, the chemical supply device comprising a bubbler,
wherein the bubbler comprises:
a lower support surface comprising a lower concave portion formed to be concave inward the bubbler;
a side surface smoothly connected to the lower support surface through a corner curved portion;
an upper surface extended from the side surface;
an inlet extended from an outside of the upper surface to an inside of the bubbler, and configured to inject an output gas for causing a chemical solution contained in the bubbler to evaporate; and
an outlet configured to transmit the chemical salutation evaporated in the bubbler,
wherein the lower concave portion has a radius of center curvature that is greater than or equal to 28% of a diameter of the lower support surface and is less than 48% of the diameter of the lower support surface in order to increase a flow velocity of the output gas sprayed from the inlet,
wherein the inlet is disposed to have a predetermined angle with respect to the lower support surface to increase the flow velocity of the output gas, and
wherein the predetermined angle is 60° to 80° inclusive.

2. The chemical supply device of claim 1, wherein the bubbler is a quartz bubbler, and
wherein the corner curved portion has a curvature that is less than or equal to 23% of the diameter of the lower support surface.

3. The chemical supply device of claim 1, wherein, in order to reduce a remaining amount of the chemical solution, the lower concave portion has a curvature of 0.015 to 0.030 when the diameter of the lower support surface is 140 mm.

4. The chemical supply device of claim 3, wherein the corner curved portion has a curvature of 0.030 to 0.065 in order to reduce the remaining amount of the chemical solution.

5. The chemical supply device of claim 4, further comprising a constant temperature bath configured to accommodate the bubbler and to maintain a temperature of the chemical solution in the bubbler.

6. The chemical supply device of claim 5, further comprising a valve structure configured to transmit the output gas to the inlet from a gas system.

7. The chemical supply device of claim 6, wherein the output gas includes a nitrogen gas.

8. The chemical supply device of claim 1, wherein the evaporated chemical solution is transmitted to a diffusion furnace.

9. An optimal bubbler structure with enhanced evaporation efficiency, the optimal bubbler structure comprising:

a lower support surface comprising a lower concave portion formed to be concave inward the bubbler;

a side surface smoothly connected to the lower support surface through a corner curved portion;

an upper surface extended from the side surface;

an inlet extended from an outside of the upper surface to an inside of the bubbler, and configured to inject an output gas for causing a chemical solution contained in the bubbler to evaporate; and an outlet configured to transmit the chemical salutation evaporated in the bubbler, wherein, in order to increase a flow velocity of the output gas sprayed from the inlet, the lower concave portion has a radius of center curvature that is greater than or equal to 48% and less than 49% of a diameter of the lower support surface, the corner curved portion has a radius of curvature that is greater than or equal to 22% and less than 23% of the diameter of the lower support surface, and the inlet is disposed to have an angle of 60° with respect to the lower support surface.

\*   \*   \*   \*   \*